US008138079B2

(12) United States Patent
Lee et al.

(10) Patent No.: US 8,138,079 B2
(45) Date of Patent: Mar. 20, 2012

(54) METHOD OF WIRE BONDING OVER ACTIVE AREA OF A SEMICONDUCTOR CIRCUIT

(75) Inventors: Jin-Yuan Lee, Hsin-Chu (TW); Ying-Chih Chen, Tainan (TW); Mou-Shiung Lin, Hsinchu (TW)

(73) Assignee: Megica Corporation, Hsinchu (TW)

( * ) Notice: Subject to any disclaimer, the term of this patent is extended or adjusted under 35 U.S.C. 154(b) by 63 days.

(21) Appl. No.: 11/926,154

(22) Filed: Oct. 29, 2007

(65) Prior Publication Data

US 2008/0233733 A1    Sep. 25, 2008

Related U.S. Application Data

(63) Continuation of application No. 10/434,142, filed on May 8, 2003.

(51) Int. Cl.
*H01L 21/28* (2006.01)
*H01L 21/60* (2006.01)
*H01L 21/768* (2006.01)

(52) U.S. Cl. ............... 438/614; 438/617; 257/E21.158; 257/E21.506; 257/E21.575

(58) Field of Classification Search .......... 257/E21.158, 257/E21.506, E21.575; 438/612–618, 622–625, 438/627, 628, 637, 642–644, 648, 650
See application file for complete search history.

(56) References Cited

U.S. PATENT DOCUMENTS

| | | | |
|---|---|---|---|
| 4,087,314 A | 5/1978 | George | |
| 4,179,802 A | 12/1979 | Joshi | |
| 4,636,832 A | 1/1987 | Abe et al. | |
| 4,652,336 A | 3/1987 | Andrascek | |
| 4,685,998 A | 8/1987 | Quinn | |
| 4,789,647 A | 12/1988 | Peters | |
| 4,811,170 A | 3/1989 | Pammer | |
| 4,927,505 A | 5/1990 | Sharma et al. | |
| 4,984,061 A * | 1/1991 | Matsumoto | 257/776 |

(Continued)

FOREIGN PATENT DOCUMENTS

EP    0986106    3/2000

(Continued)

OTHER PUBLICATIONS

Spiral Inductors and Transmission Lines in Silicon Technology using Copper-Damoscene Inter connects and Low-Loss Substrates, by Joachim N. Burghartz et al., XP-000/04848 IEEE 1997, Theary and Technigues, vol. 45, No. 10, Oct. 1997, pp. 1961-1968.

(Continued)

*Primary Examiner* — Marcos D. Pizarro
(74) *Attorney, Agent, or Firm* — McDermott Will & Emery LLP

(57) ABSTRACT

A method and structure are provided to enable wire bond connections over active and/or passive devices and/or low-k dielectrics, formed on an Integrated Circuit die. A semiconductor substrate having active and/or passive devices is provided, with interconnect metallization formed over the active and/or passive devices. A passivation layer formed over the interconnect metallization is provided, wherein openings are formed in the passivation layer to an upper metal layer of the interconnect metallization. Compliant metal bond pads are formed over the passivation layer, wherein the compliant metal bond pads are connected through the openings to the upper metal layer, and wherein the compliant metal bond pads are formed substantially over the active and/or passive devices. The compliant metal bond pads may be formed of a composite metal structure.

38 Claims, 6 Drawing Sheets

U.S. PATENT DOCUMENTS

| | | |
|---|---|---|
| 5,036,383 A | 7/1991 | Mori |
| 5,061,985 A | 10/1991 | Meguro |
| 5,071,518 A | 12/1991 | Pan |
| 5,083,187 A | 1/1992 | Lamson |
| 5,108,950 A | 4/1992 | Wakabayashi et al. |
| 5,132,775 A | 7/1992 | Brighton |
| 5,134,460 A | 7/1992 | Brady |
| 5,148,265 A | 9/1992 | Khandros et al. |
| 5,148,266 A | 9/1992 | Khandros et al. |
| 5,226,232 A | 7/1993 | Boyd |
| 5,258,330 A | 11/1993 | Khandros et al. |
| 5,261,155 A | 11/1993 | Angulas |
| 5,272,111 A | 12/1993 | Kosaki |
| 5,282,312 A | 2/1994 | DiStefano et al. |
| 5,346,861 A | 9/1994 | Khandros et al. |
| 5,347,159 A | 9/1994 | Khandros et al. |
| 5,384,284 A | 1/1995 | Doan |
| 5,384,486 A | 1/1995 | Konno |
| 5,384,488 A | 1/1995 | Golshan et al. |
| 5,418,186 A | 5/1995 | Park |
| 5,468,984 A | 11/1995 | Efland |
| 5,477,611 A | 12/1995 | Sweis |
| 5,478,973 A | 12/1995 | Yoon |
| 5,508,228 A | 4/1996 | Nolan et al. |
| 5,518,964 A | 5/1996 | DiStefano et al. |
| 5,532,512 A | 7/1996 | Fillion |
| 5,539,241 A | 7/1996 | Abidi |
| 5,541,135 A | 7/1996 | Pfeifer |
| 5,548,091 A | 8/1996 | DiStefano |
| 5,565,379 A | 10/1996 | Baba |
| 5,570,504 A | 11/1996 | DiStefano et al. |
| 5,583,321 A | 12/1996 | DiStefano et al. |
| 5,600,180 A | 2/1997 | Kusaka |
| 5,629,240 A | 5/1997 | Malladi |
| 5,631,499 A | 5/1997 | Hosomi |
| 5,640,761 A | 6/1997 | DiStefano et al. |
| 5,647,942 A | 7/1997 | Haji |
| 5,656,858 A | 8/1997 | Kondo |
| 5,656,863 A | 8/1997 | Yasunaga |
| 5,659,201 A | 8/1997 | Wollesen |
| 5,659,952 A | 8/1997 | Kovac et al. |
| 5,663,106 A | 9/1997 | Karavakis |
| 5,664,642 A | 9/1997 | Williams |
| 5,665,639 A | 9/1997 | Seppala et al. |
| 5,665,989 A | 9/1997 | Dangelo |
| 5,679,977 A | 10/1997 | Khandros et al. |
| 5,682,061 A | 10/1997 | Khandros et al. |
| 5,685,885 A | 11/1997 | Khandros et al. |
| 5,688,716 A | 11/1997 | DiStefano et al. |
| 5,691,248 A | 11/1997 | Cronin |
| 5,706,174 A | 1/1998 | DiStefano et al. |
| 5,719,448 A | 2/1998 | Ichikawa |
| 5,751,065 A | 5/1998 | Chittipeddi et al. |
| 5,767,010 A | 6/1998 | Mis |
| 5,767,564 A | 6/1998 | Kunimatsu |
| 5,773,899 A | 6/1998 | Zambrano |
| 5,776,796 A | 7/1998 | DiStefano |
| 5,792,594 A | 8/1998 | Brown et al. |
| 5,798,286 A | 8/1998 | Faraci et al. |
| 5,800,555 A | 9/1998 | Gray, III |
| 5,801,441 A | 9/1998 | DiStefano et al. |
| 5,821,608 A | 10/1998 | DiStefano et al. |
| 5,830,782 A | 11/1998 | Smith et al. |
| 5,834,339 A | 11/1998 | DiStefano |
| 5,834,844 A | 11/1998 | Akagawa |
| 5,848,467 A | 12/1998 | Khandros et al. |
| 5,852,326 A | 12/1998 | Khandros et al. |
| 5,854,513 A | 12/1998 | Kim |
| 5,854,740 A | 12/1998 | Cha |
| 5,861,666 A | 1/1999 | Bellaar |
| 5,875,545 A | 3/1999 | DiStefano |
| 5,883,435 A | 3/1999 | Geffken |
| 5,892,273 A | 4/1999 | Iwasaki |
| 5,898,222 A | 4/1999 | Farooq |
| 5,910,644 A | 6/1999 | Goodman |
| 5,913,109 A | 6/1999 | DiStefano et al. |
| 5,915,169 A | 6/1999 | Heo |
| 5,915,170 A | 6/1999 | Raab et al. |
| 5,925,931 A | 7/1999 | Yamamoto |
| 5,938,105 A | 8/1999 | Singh |
| 5,942,800 A | 8/1999 | Yiu |
| 5,943,597 A | 8/1999 | Kleffner |
| 5,950,304 A | 9/1999 | Khandros et al. |
| 5,952,726 A | 9/1999 | Liang |
| 5,959,354 A | 9/1999 | Smith et al. |
| 5,969,424 A | 10/1999 | Matsuki et al. |
| 5,983,492 A | 11/1999 | Fjelstad |
| 5,989,936 A | 11/1999 | Smith et al. |
| 5,994,766 A | 11/1999 | Shenoy |
| 5,994,781 A | 11/1999 | Smith |
| 6,004,831 A | 12/1999 | Yamazaki |
| 6,011,314 A | 1/2000 | Leibovitz |
| 6,012,224 A | 1/2000 | DiStefano et al. |
| 6,013,571 A | 1/2000 | Morrell |
| 6,022,792 A | 2/2000 | Ishii |
| 6,025,261 A | 2/2000 | Farrar |
| 6,030,856 A | 2/2000 | DiStefano et al. |
| 6,037,668 A | 3/2000 | Cave |
| 6,042,953 A | 3/2000 | Yamaguchi |
| 6,043,430 A | 3/2000 | Chun |
| 6,045,655 A | 4/2000 | DiStefano |
| 6,046,076 A | 4/2000 | Mitchell et al. |
| 6,054,337 A | 4/2000 | Solberg |
| 6,066,877 A | 5/2000 | Williams |
| 6,075,289 A | 6/2000 | DiStefano |
| 6,075,290 A | 6/2000 | Schaefer |
| 6,077,726 A | 6/2000 | Mistry |
| 6,080,526 A | 6/2000 | Yang et al. |
| 6,080,603 A | 6/2000 | DiStefano et al. |
| 6,093,964 A | 7/2000 | Saitoh |
| 6,104,087 A | 8/2000 | DiStefano et al. |
| 6,107,123 A | 8/2000 | DiStefano et al. |
| 6,117,964 A | 9/2000 | Falcone |
| 6,121,676 A | 9/2000 | Solberg |
| 6,126,428 A | 10/2000 | Mitchell et al. |
| 6,127,724 A | 10/2000 | DiStefano |
| 6,133,627 A | 10/2000 | Khandros et al. |
| 6,133,639 A | 10/2000 | Kovac et al. |
| 6,143,396 A | 11/2000 | Saran |
| 6,144,100 A | 11/2000 | Shen |
| 6,147,400 A | 11/2000 | Faraci et al. |
| 6,147,401 A | 11/2000 | Solberg |
| 6,147,857 A | 11/2000 | Worley |
| 6,157,079 A | 12/2000 | Taguchi |
| 6,169,319 B1 | 1/2001 | Malinovich |
| 6,169,328 B1 | 1/2001 | Mitchell et al. |
| 6,177,636 B1 | 1/2001 | Fjelstad |
| 6,180,265 B1 | 1/2001 | Erickson |
| 6,184,121 B1 | 2/2001 | Buchwalter et al. |
| 6,184,143 B1 | 2/2001 | Ohashi |
| 6,187,680 B1 | 2/2001 | Costrini et al. |
| 6,191,368 B1 | 2/2001 | DiStefano et al. |
| 6,194,291 B1 | 2/2001 | DiStefano et al. |
| 6,197,181 B1 | 3/2001 | Chen |
| 6,198,619 B1 | 3/2001 | Fujioka |
| 6,202,298 B1 | 3/2001 | Smith |
| 6,202,299 B1 | 3/2001 | DiStefano et al. |
| 6,204,074 B1 | 3/2001 | Bertolet et al. |
| 6,207,547 B1 | 3/2001 | Chittipeddi |
| 6,217,972 B1 | 4/2001 | Beroz et al. |
| 6,221,752 B1 | 4/2001 | Chou |
| 6,228,685 B1 | 5/2001 | Beroz et al. |
| 6,228,686 B1 | 5/2001 | Smith et al. |
| 6,229,100 B1 | 5/2001 | Fjelstad |
| 6,229,221 B1 | 5/2001 | Kloen et al. |
| 6,229,711 B1 | 5/2001 | Yoneda |
| 6,232,152 B1 | 5/2001 | DiStefano et al. |
| 6,232,662 B1 | 5/2001 | Saran |
| 6,235,552 B1 | 5/2001 | Kwon |
| 6,236,103 B1 | 5/2001 | Bernstein |
| 6,239,384 B1 | 5/2001 | Smith et al. |
| 6,242,338 B1 | 6/2001 | Liu |
| 6,250,541 B1 | 6/2001 | Shangguan |
| 6,259,593 B1 | 7/2001 | Moriwaki |
| 6,265,759 B1 | 7/2001 | DiStefano et al. |
| 6,265,765 B1 | 7/2001 | DiStefano et al. |
| 6,280,828 B1 | 8/2001 | Nakatsuka |

| Patent No. | Date | Inventor |
|---|---|---|
| 6,281,588 B1 | 8/2001 | DiStefano et al. |
| 6,288,447 B1 | 9/2001 | Amishiro |
| 6,294,040 B1 | 9/2001 | Raab et al. |
| 6,300,234 B1 | 10/2001 | Flynn |
| 6,303,423 B1 | 10/2001 | Lin |
| 6,307,260 B1 | 10/2001 | Smith et al. |
| 6,309,915 B1 | 10/2001 | DiStefano |
| 6,313,528 B1 | 11/2001 | Solberg |
| 6,329,605 B1 | 12/2001 | Beroz et al. |
| 6,329,607 B1 | 12/2001 | Fjelstad et al. |
| 6,338,982 B1 | 1/2002 | Beroz et al. |
| 6,346,484 B1 | 2/2002 | Cotte |
| 6,354,485 B1 | 3/2002 | DiStefano |
| 6,359,328 B1 | 3/2002 | Dubin |
| 6,359,335 B1 | 3/2002 | DiStefano et al. |
| 6,361,959 B1 | 3/2002 | Beroz et al. |
| 6,362,087 B1 | 3/2002 | Wang |
| 6,365,436 B1 | 4/2002 | Faraci et al. |
| 6,365,975 B1 | 4/2002 | DiStefano et al. |
| 6,370,032 B1 | 4/2002 | DiStefano et al. |
| 6,372,527 B1 | 4/2002 | Khandros et al. |
| 6,372,622 B1 | 4/2002 | Tan |
| 6,373,141 B1 | 4/2002 | DiStefano et al. |
| 6,376,353 B1 | 4/2002 | Zhou et al. |
| 6,378,759 B1 | 4/2002 | Ho |
| 6,380,061 B1 | 4/2002 | Kobayashi |
| 6,383,916 B1 | 5/2002 | Lin |
| 6,384,486 B2 | 5/2002 | Zuniga |
| 6,387,734 B1 | 5/2002 | Inaba et al. |
| 6,388,340 B2 | 5/2002 | DiStefano |
| 6,392,306 B1 | 5/2002 | Khandros et al. |
| 6,410,435 B1 | 6/2002 | Ryan |
| 6,417,029 B1 | 7/2002 | Fjelstad |
| 6,417,087 B1 * | 7/2002 | Chittipeddi et al. .......... 438/612 |
| 6,417,088 B1 | 7/2002 | Ho |
| 6,420,661 B1 | 7/2002 | DiStefano et al. |
| 6,423,907 B1 | 7/2002 | Haba et al. |
| 6,426,281 B1 | 7/2002 | Lin |
| 6,429,112 B1 | 8/2002 | Smith et al. |
| 6,429,120 B1 | 8/2002 | Ahn |
| 6,429,531 B1 | 8/2002 | Mistry |
| 6,433,419 B2 | 8/2002 | Khandros et al. |
| 6,451,681 B1 | 9/2002 | Greer |
| 6,452,270 B1 | 9/2002 | Huang |
| 6,455,880 B1 | 9/2002 | Ono |
| 6,455,915 B1 | 9/2002 | Wong |
| 6,458,681 B1 | 10/2002 | DiStefano et al. |
| 6,460,245 B1 | 10/2002 | DiStefano |
| 6,465,878 B2 | 10/2002 | Fjelstad et al. |
| 6,465,879 B1 | 10/2002 | Taguchi |
| 6,465,893 B1 | 10/2002 | Khandros et al. |
| 6,467,674 B1 | 10/2002 | Mihara |
| 6,468,836 B1 | 10/2002 | DiStefano et al. |
| 6,472,745 B1 | 10/2002 | Iizuka |
| 6,475,904 B2 | 11/2002 | Okoroanyanwu |
| 6,476,491 B2 | 11/2002 | Harada et al. |
| 6,476,506 B1 | 11/2002 | O'Connor |
| 6,476,507 B1 | 11/2002 | Takehara |
| 6,479,900 B1 | 11/2002 | Shinogi |
| 6,486,003 B1 | 11/2002 | Fjelstad |
| 6,486,547 B2 | 11/2002 | Smith et al. |
| 6,492,251 B1 | 12/2002 | Haba et al. |
| 6,495,397 B2 | 12/2002 | Kubota |
| 6,495,442 B1 | 12/2002 | Lin |
| 6,495,462 B1 | 12/2002 | Haba et al. |
| 6,499,216 B1 | 12/2002 | Fjelstad |
| 6,501,169 B1 | 12/2002 | Aoki |
| 6,521,480 B1 | 2/2003 | Mitchell et al. |
| 6,525,429 B1 | 2/2003 | Kovac et al. |
| 6,528,881 B1 | 3/2003 | Tsuboi |
| 6,541,852 B2 | 4/2003 | Beroz et al. |
| 6,543,131 B1 | 4/2003 | Beroz et al. |
| 6,544,880 B1 | 4/2003 | Akram |
| 6,555,296 B2 | 4/2003 | Jao |
| 6,557,253 B1 | 5/2003 | Haba et al. |
| 6,560,862 B1 | 5/2003 | Chen et al. |
| 6,570,101 B2 | 5/2003 | DiStefano et al. |
| 6,573,598 B2 | 6/2003 | Ohuchi |
| 6,573,609 B2 | 6/2003 | Fjelstad et al. |
| 6,578,754 B1 | 6/2003 | Tung |
| 6,586,309 B1 | 7/2003 | Yeo |
| 6,592,019 B2 | 7/2003 | Tung |
| 6,593,222 B2 | 7/2003 | Smoak |
| 6,593,649 B1 | 7/2003 | Lin et al. |
| 6,600,234 B2 | 7/2003 | Kuwabara |
| 6,605,528 B1 | 8/2003 | Lin |
| 6,614,091 B1 | 9/2003 | Downey |
| 6,627,988 B2 | 9/2003 | Andoh |
| 6,635,553 B1 | 10/2003 | DiStefano et al. |
| 6,639,299 B2 | 10/2003 | Aoki |
| 6,646,347 B2 | 11/2003 | Mercado |
| 6,649,509 B1 | 11/2003 | Lin et al. |
| 6,651,321 B2 | 11/2003 | Beroz et al. |
| 6,653,172 B2 | 11/2003 | DiStefano et al. |
| 6,653,563 B2 | 11/2003 | Bohr |
| 6,661,100 B1 | 12/2003 | Anderson |
| 6,664,484 B2 | 12/2003 | Haba et al. |
| 6,673,690 B2 | 1/2004 | Chuang |
| 6,680,544 B2 | 1/2004 | Lu |
| 6,683,380 B2 | 1/2004 | Efland |
| 6,686,015 B2 | 2/2004 | Raab et al. |
| 6,687,842 B1 | 2/2004 | DiStefano et al. |
| 6,690,186 B2 | 2/2004 | Fjelstad |
| 6,696,357 B2 | 2/2004 | Imai |
| 6,698,646 B2 | 3/2004 | Chen |
| 6,699,730 B2 | 3/2004 | Kim et al. |
| 6,706,622 B1 | 3/2004 | McCormick |
| 6,707,124 B2 | 3/2004 | Wachtler |
| 6,707,159 B1 | 3/2004 | Kumamoto |
| 6,709,895 B1 | 3/2004 | DiStefano |
| 6,709,899 B2 | 3/2004 | Fjelstad |
| 6,710,460 B2 | 3/2004 | Morozumi |
| 6,717,238 B2 | 4/2004 | Ker |
| 6,720,659 B1 | 4/2004 | Akahori |
| 6,723,584 B2 | 4/2004 | Kovac et al. |
| 6,723,628 B2 | 4/2004 | Matsumoto |
| 6,727,590 B2 | 4/2004 | Izumitani |
| 6,730,982 B2 | 5/2004 | Barth et al. |
| 6,731,003 B2 | 5/2004 | Joshi |
| 6,732,913 B2 | 5/2004 | Alvarez |
| 6,737,265 B2 | 5/2004 | Beroz et al. |
| 6,750,539 B2 | 6/2004 | Haba et al. |
| 6,753,249 B1 | 6/2004 | Chen |
| 6,756,295 B2 | 6/2004 | Lin et al. |
| 6,762,115 B2 | 7/2004 | Lin et al. |
| 6,762,122 B2 | 7/2004 | Mis |
| 6,763,579 B2 | 7/2004 | Haba et al. |
| 6,764,939 B1 | 7/2004 | Yoshitaka |
| 6,774,317 B2 | 8/2004 | Fjelstad |
| 6,780,747 B2 | 8/2004 | DiStefano |
| 6,780,748 B2 | 8/2004 | Yamaguchi |
| 6,798,050 B1 | 9/2004 | Homma |
| 6,800,555 B2 | 10/2004 | Test et al. |
| 6,809,020 B2 | 10/2004 | Sakurai |
| 6,815,324 B2 | 11/2004 | Huang |
| 6,826,827 B1 | 12/2004 | Fjelstad |
| 6,828,668 B2 | 12/2004 | Smith et al. |
| 6,835,595 B1 | 12/2004 | Suzuki et al. |
| 6,841,872 B1 | 1/2005 | Ha |
| 6,844,631 B2 | 1/2005 | Yong |
| 6,848,173 B2 | 2/2005 | Fjelstad et al. |
| 6,853,076 B2 | 2/2005 | Datta |
| 6,856,007 B2 | 2/2005 | Warner |
| 6,861,740 B2 | 3/2005 | Hsu |
| 6,861,742 B2 | 3/2005 | Miyamoto |
| 6,864,165 B2 | 3/2005 | Pogge |
| 6,870,272 B2 | 3/2005 | Kovac et al. |
| 6,876,212 B2 | 4/2005 | Fjelstad |
| 6,885,106 B1 | 4/2005 | Damberg et al. |
| 6,940,169 B2 | 9/2005 | Jin |
| 6,943,440 B2 | 9/2005 | Kim |
| 6,952,047 B2 | 10/2005 | Li |
| 6,963,136 B2 | 11/2005 | Shinozaki |
| 6,965,158 B2 | 11/2005 | Smith et al. |
| 6,972,495 B2 | 12/2005 | Fjelstad |
| 6,979,647 B2 | 12/2005 | Bojkov |
| 6,998,710 B2 | 2/2006 | Kobayashi |
| 7,008,867 B2 | 3/2006 | Lei |

| | | |
|---|---|---|
| 7,012,323 B2 | 3/2006 | Warner et al. |
| 7,023,088 B2 | 4/2006 | Suzuki et al. |
| 7,060,607 B2 | 6/2006 | Efland |
| 7,098,078 B2 | 8/2006 | Khandros et al. |
| 7,098,127 B2 | 8/2006 | Ito |
| 7,114,250 B2 | 10/2006 | Haba et al. |
| 7,135,766 B1 | 11/2006 | Costa |
| 7,138,299 B2 | 11/2006 | Fjelstad |
| 7,149,095 B2 | 12/2006 | Warner et al. |
| 7,152,311 B2 | 12/2006 | Beroz et al. |
| 7,157,363 B2 | 1/2007 | Suzuki et al. |
| 7,166,914 B2 | 1/2007 | DiStefano et al. |
| 7,176,506 B2 | 2/2007 | Beroz et al. |
| 7,183,643 B2 | 2/2007 | Gibson et al. |
| 7,198,969 B1 | 4/2007 | Khandros et al. |
| 7,220,657 B2 | 5/2007 | Ihara |
| 7,229,850 B2 | 6/2007 | Li |
| 7,230,340 B2 | 6/2007 | Lin |
| 7,239,028 B2 | 7/2007 | Anzai |
| 7,246,432 B2 | 7/2007 | Tanaka et al. |
| 7,268,426 B2 | 9/2007 | Warner et al. |
| 7,271,481 B2 | 9/2007 | Khandros et al. |
| 7,272,888 B2 | 9/2007 | DiStefano |
| 7,288,845 B2 | 10/2007 | Sutardja |
| 7,291,910 B2 | 11/2007 | Khandros et al. |
| 7,335,536 B2 | 2/2008 | Lange |
| 7,368,818 B2 | 5/2008 | Kovac et al. |
| 7,372,153 B2 | 5/2008 | Kuo et al. |
| 7,420,276 B2 | 9/2008 | Lin |
| 7,420,283 B2 | 9/2008 | Ito |
| 7,427,423 B2 | 9/2008 | Beroz et al. |
| 7,454,834 B2 | 11/2008 | DiStefano |
| 7,456,089 B2 | 11/2008 | Aiba |
| 7,462,932 B2 | 12/2008 | Haba et al. |
| 7,462,942 B2 | 12/2008 | Tan |
| 7,470,997 B2 | 12/2008 | Lin |
| 7,528,008 B2 | 5/2009 | Fjelstad |
| 7,531,894 B2 | 5/2009 | Fjelstad |
| 7,547,969 B2 | 6/2009 | Chou |
| 7,566,955 B2 | 7/2009 | Warner |
| 7,582,966 B2 | 9/2009 | Lin |
| 7,582,968 B2 | 9/2009 | Shimoishizaka |
| 7,589,409 B2 | 9/2009 | Gibson et al. |
| 7,754,537 B2 | 7/2010 | Haba et al. |
| 2001/0000032 A1 | 3/2001 | Smith et al. |
| 2001/0005044 A1 | 6/2001 | Fjelstad |
| 2001/0010400 A1 | 8/2001 | Smith |
| 2001/0019905 A1 | 9/2001 | DiStefano et al. |
| 2001/0022396 A1 | 9/2001 | DiStefano et al. |
| 2001/0030370 A1 | 10/2001 | Khandros et al. |
| 2001/0033032 A1 | 10/2001 | Ono |
| 2001/0035452 A1 | 11/2001 | Test |
| 2001/0040290 A1 | 11/2001 | Sakurai |
| 2001/0050425 A1 | 12/2001 | Beroz et al. |
| 2001/0051426 A1* | 12/2001 | Pozder et al. ............ 438/666 |
| 2002/0000671 A1 | 1/2002 | Zuniga et al. |
| 2002/0006718 A1 | 1/2002 | DiStefano |
| 2002/0007904 A1 | 1/2002 | Raab et al. |
| 2002/0009827 A1 | 1/2002 | Beroz et al. |
| 2002/0011663 A1 | 1/2002 | Khandros et al. |
| 2002/0043723 A1 | 4/2002 | Shimizu |
| 2002/0068384 A1 | 6/2002 | Beroz et al. |
| 2002/0068385 A1 | 6/2002 | Ma et al. |
| 2002/0068426 A1 | 6/2002 | Fjelstad et al. |
| 2002/0075016 A1 | 6/2002 | Fjelstad et al. |
| 2002/0094671 A1 | 7/2002 | DiStefano et al. |
| 2002/0096787 A1 | 7/2002 | Fjelstad |
| 2002/0109213 A1 | 8/2002 | Kovac et al. |
| 2002/0121702 A1 | 9/2002 | Higgins, III |
| 2002/0148639 A1 | 10/2002 | Smith et al. |
| 2002/0155728 A1 | 10/2002 | Khandros et al. |
| 2002/0158334 A1 | 10/2002 | Vu |
| 2002/0168797 A1 | 11/2002 | DiStefano |
| 2002/0175419 A1 | 11/2002 | Wang |
| 2002/0184758 A1 | 12/2002 | DiStefano et al. |
| 2003/0006062 A1 | 1/2003 | Stone |
| 2003/0027373 A1 | 2/2003 | DiStefano et al. |
| 2003/0027374 A1 | 2/2003 | Kovac et al. |
| 2003/0060032 A1 | 3/2003 | Beroz et al. |
| 2003/0071346 A1 | 4/2003 | Smith et al. |
| 2003/0087130 A1 | 5/2003 | Sugawara |
| 2003/0168253 A1 | 9/2003 | Khandros et al. |
| 2003/0218246 A1 | 11/2003 | Abe |
| 2004/0007779 A1 | 1/2004 | Arbuthnot |
| 2004/0023450 A1 | 2/2004 | Katagiri |
| 2004/0035519 A1 | 2/2004 | Beroz |
| 2004/0070042 A1 | 4/2004 | Lee |
| 2004/0080328 A1 | 4/2004 | Fjelstad |
| 2004/0166659 A1 | 8/2004 | Lin et al. |
| 2004/0183197 A1 | 9/2004 | Matsuoka |
| 2004/0262742 A1 | 12/2004 | DiStefano et al. |
| 2005/0085012 A1 | 4/2005 | Fjelstad |
| 2005/0087855 A1 | 4/2005 | Khandros et al. |
| 2005/0139986 A1 | 6/2005 | Kovac et al. |
| 2005/0155223 A1 | 7/2005 | Fjelstad et al. |
| 2005/0194672 A1 | 9/2005 | Gibson et al. |
| 2005/0218495 A1 | 10/2005 | Khandros et al. |
| 2006/0049498 A1 | 3/2006 | Kovac et al. |
| 2006/0060961 A1 | 3/2006 | Lin |
| 2006/0113645 A1 | 6/2006 | Warner et al. |
| 2006/0225272 A1 | 10/2006 | DiStefano |
| 2006/0244135 A1 | 11/2006 | Khandros et al. |
| 2007/0026660 A1 | 2/2007 | Yamasaki |
| 2007/0066046 A1 | 3/2007 | Fjelstad |
| 2007/0096160 A1 | 5/2007 | Beroz et al. |
| 2007/0290316 A1 | 12/2007 | Gibson et al. |
| 2009/0200654 A1 | 8/2009 | Fjelstad |
| 2009/0200655 A1 | 8/2009 | Fjelstad |
| 2009/0236406 A1 | 9/2009 | Fjelstad |
| 2010/0013108 A1 | 1/2010 | Gibson |

FOREIGN PATENT DOCUMENTS

| | | |
|---|---|---|
| EP | 0999580 | 5/2000 |
| EP | 1536469 | 6/2005 |
| FR | 2793943 | 11/2000 |
| JP | 58028858 | 2/1983 |
| JP | 60217646 | 10/1985 |
| JP | 2003019358 | 1/1991 |
| JP | 4278543 | 10/1992 |
| JP | 4318935 | 11/1992 |
| JP | 1961221 | 8/1995 |
| JP | 1985660 | 10/1995 |
| JP | 8013166 | 1/1996 |
| JP | 2785338 | 8/1998 |
| JP | 2000192216 | 7/2000 |
| JP | 2000022085 | 8/2000 |
| JP | 2000260803 | 9/2000 |
| JP | 2004335255 | 11/2004 |
| JP | 2005284490 | 10/2005 |
| JP | 3829325 | 10/2006 |
| JP | 3850261 | 11/2006 |
| JP | 3856304 | 12/2006 |
| JP | 3969295 | 9/2007 |
| JP | 4221606 | 2/2009 |
| JP | 4235834 | 3/2009 |
| KR | 1020030091448 | 12/2003 |
| TW | 432560 | 5/2001 |
| TW | 492168 | 6/2002 |
| TW | 559965 | 11/2003 |
| TW | 574740 | 2/2004 |
| WO | WO9609746 | 3/1996 |
| WO | WO9711588 | 3/1997 |
| WO | WO9828955 | 7/1998 |
| WO | WO9844564 | 10/1998 |
| WO | WO9940761 | 8/1999 |
| WO | WO 0035013 | 6/2000 |
| WO | WO0054321 | 9/2000 |
| WO | WO03021673 | 3/2003 |
| WO | WO2004080134 | 9/2004 |

OTHER PUBLICATIONS

The Effects of a Ground Shield on Spiral Inductors Fabricated in a Silicon Bipolar Technology, IEEE Berm 9.1 by seang—moyiun et al., pp. 157-160, 2000IEEE.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.
Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.
Gao, X. et al. "An improved electrostatic discharge protection structure for reducing triggering voltage and parasitic capacitance," Solid-State Electronics, 27 (2003), pp. 1105-1110.
Yeoh, A. et al. "Copper Die Bumps (First Level Interconnect) and Low-K Dielectrics in 65nm High Volume Manufacturing," Electronic Components and Technology Conference (2006) pp. 1611-1615.
Hu, C-K. et al. "Copper-Polyimide Wiring Technology for VLSI Circuits," Materials Research Society Symposium Proceedings VLSI V (1990) pp. 369-373.
Roesch, W. et al: "Cycling copper flip chip interconnects," Microelectronics Reliability, 44 (2004) pp. 1047-1054.
Lee, Y-H. et al. "Effect of ESD Layout on the Assembly Yield and Reliability," International Electron Devices Meeting (2006) pp. 1-4.
Yeoh, Y-S. "ESD Effects On Power Supply Clamps," Proceedings of the 65th International Symposium on Physical & Failure Analysis of Integrated Circuits (1997) pp. 121-124.
Edelstein, D. et al. "Full Copper Wiring in a Sub-0.25 pm CMOS ULSI Technology," Technical Digest IEEE International Electron Devices Meeting (1997) pp. 773-776.
Venkatesan, S. et al. "A High Performance 1.8V, 0.20pm CMOS Technology with Copper Metallization," Technical Digest IEEE International Electron Devices. Meeting (1997) pp. 769-772.
Jenei, S. et al. "High Q Inductor Add-on Module in Thick Cu/SiLK™ single damascene," Proceedings from the IEEE International Interconnect Technology Conference (2001) pp. 107-109.
Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.
Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.
Kumar, R. et al. "A Family of 45nm IA Processors," IEEE International Solid-State Circuits Conference, Session 3, Microprocessor Technologies, 3.2 (2009) pp. 58-59.
Bohr, M. "The New Era of Scaling in an SoC World," International Solid-State Circuits Conference (2009) Presentation Slides 1-66.
Bohr, M. "The New Era of Scaling in an SoC World," International Solid-State Circuits Conference (2009) pp. 23-28.
Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.
Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.
Geffken, R. M. "An Overview of Polyimide Use in Integrated Circuits and Packaging," Proceedings of the Third International Symposium on Ultra Large Scale Integration Science and Technology (1991) pp. 667-677.
Luther, B. et al. "Planar Copper-Polyimide Back End of the Line Interconnections for ULSI Devices," Proceedings of the 10th International IEEE VLSI Multilevel Interconnection Conference (1993) pp. 15-21.
Master, R. et al. "Ceramic Mini-Ball Grid Array Package for High Speed Device," Proceedings from the 45th Electronic Components and Technology Conference (1995) pp. 46-50.
Maloney, T. et al. "Stacked PMOS Clamps for High Voltage Power Supply Protection," Electrical Overstress/Electrostatic Discharge Symposium Proceedings (1999) pp. 70-77.
Lin, M.S. et al. "A New System-on-a-Chip (SOC) Technology—High Q Post Passivation Inductors," Proceedings from the 53rd Electronic Components and Technology Conference (May 30, 2003) pp. 1503-1509.
Megic Corp. "MEGIC way to system solutions through bumping and redistribution," (Brochure) (Feb. 6, 2004) pp. 1-3.
Lin, M.S. "Post Passivation Technology™—MEGIC® Way to System Solutions," Presentation given at TSMC Technology Symposium, Japan (Oct. 1, 2003) pp. 1-32.
Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.
Brintzinger, A., et al. Infineon Presentation Entitled, "Electroplating for Infineon Wafer-level-package Technology," 21 pgs., Oct. 9, 2003.
Hedler, H., et al. "Bump Wafer Level Packaging, A New Packaging Platform (not only) for Memory Products," International Symposium on Microelectronics, International Microelectronics And Packaging Society, pp. 681-686, Nov. 18-20, 2003.
H. Hedler, T. Meyer, W. Leiberg, and R. Irsigler, "Bump wafer level packaging: A new packaging platform (not only) for memory products." IMAPS, 2003 International Symposium on Microelectronics, Nov. 2003, pp. 681-686.
R. Dudek, H. Walter, R. Doering, B. Michel, T. Meyer, J. Zapf, and H. Hedler, "Thermomechanical design for reliability of WLPs with compliant interconnects." Electronics Packaging Technology Conference, 2005, pp. 328-334.
Jen-Huang Jeng and T. E. Hsieh, "Application of Al/PI Composite Bumps to COG Bonding Process." IEEE Transactions on Components and Packaging Technologies, vol. 24, No. 2, Jun. 2001, pp. 271-278.
Lammers, D.; "LSI Logic Extends Reach of Wire Bond Packaging", EE Times Oct. 23, 2002 at <http:/'www.eet.com/story/OEG20021022S00> visited on Oct. 23, 2002, 4 pages total.
Tummala et al., Microelectronics Packaging Handbook: Semiconductor Packaging Part II, Second Edition, Kluwer Academic Publishers, pp. 11-186, 1997.

* cited by examiner

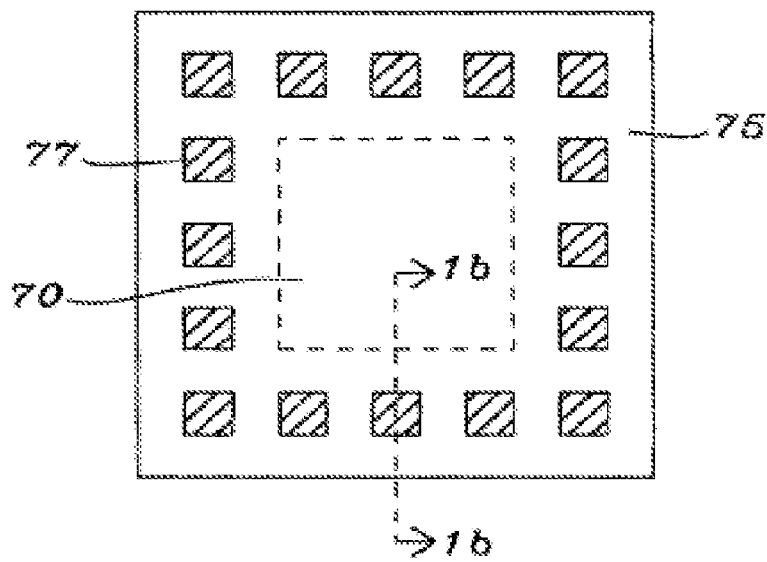
FIG. 1a – Prior Art
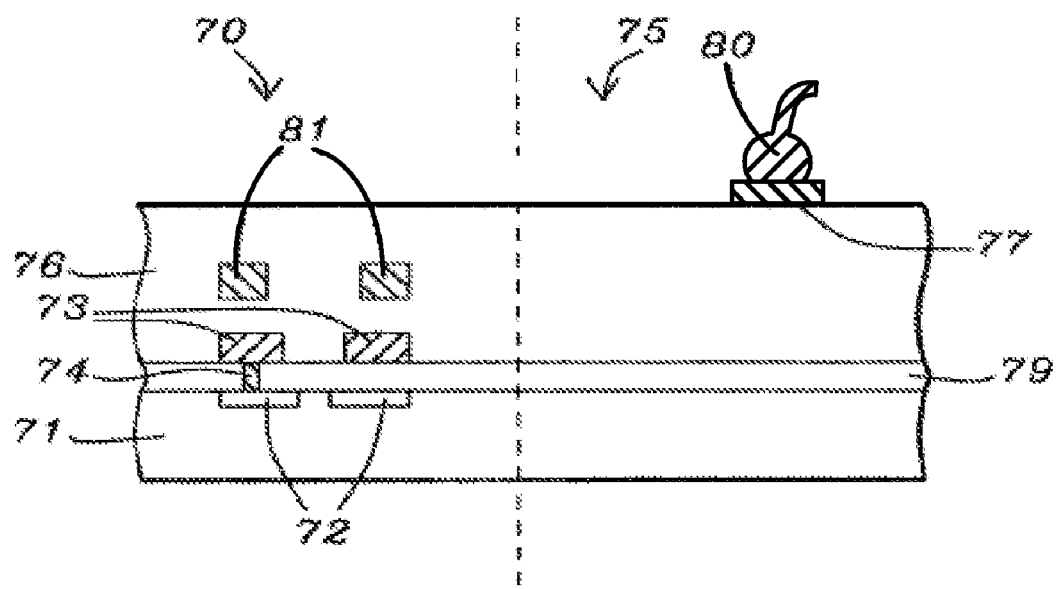
FIG. 1b – Prior Art

METHOD OF WIRE BONDING OVER ACTIVE AREA OF A SEMICONDUCTOR CIRCUIT

This application is a continuation application of Ser. No. 10/434,142, filed on May 8, 2003, which claims priority to Provisional Patent Application Ser. No. 60/418,551, filed on Oct. 15, 2002, both of which are herein incorporated by reference in their entirety.

RELATED PATENT APPLICATIONS

This application is related to (MEG00-003), filed on May, 7, 2001, Ser. No. 09/858,528, now issued as U.S. Pat. No. 6,593,649 and to (MEG02-009), filed on May 8, 2003, Ser. No. 10/434,524, both assigned (under a joint Assignment) to the Assignee of the instant invention.

BACKGROUND OF THE INVENTION (1) Field of the Invention

The invention relates to the fabrication of integrated circuit devices, and more particularly to the fabrication of wire bond pads over underlying active devices, passive devices and/or weak dielectric layers.

(2) Background of the Invention

Performance characteristics of semiconductor devices are typically improved by reducing device dimensions, resulting in increased device densities and increased device packaging densities. This increase in device density places increased requirements on the interconnection of semiconductor devices, which are addressed by the packaging of semiconductor devices. One of the key considerations in the package design is the accessibility of the semiconductor device or the Input/Output (I/O) capability of the package after one or more devices have been mounted in the package.

In a typical semiconductor device package, the semiconductor die can be mounted or positioned in the package and can further be connected to interconnect lines of the substrate by bond wires or solder bumps. For this purpose the semiconductor die is provided with pads (bond pads) that are, typically mounted around the perimeter of the die, and are located such as not to be formed over regions containing active or passive devices.

One reason the bond pads are not formed over the active or passive devices is related to the thermal and/or mechanical stresses that occur during the wire bonding process. During wirebonding, wires are connected from the bond pads to a supporting circuit board or to other means of interconnections.

The semiconductor industry has recently turned increasingly to low dielectric-constant (or low-k) materials for inter-metal dielectrics. However, such materials typically have lower mechanical strength than traditional insulating materials and are thus also susceptible to damage by wire bonding.

U.S. Pat. No. 4,636,832 (Abe et al.) describes a method of forming a bond pad over an active area, using a silicon layer for stress reduction.

U.S. Pat. No. 5,751,065 (Chittipeddi et al.) discloses a method of providing an integrated circuit with active devices under the bond pads, and uses metal for stress relief.

U.S. Pat. No. 6,384,486 (Zuniga et al.) shows a method of forming an integrated circuit under a contact pad, also using a metal layer for stress absorption.

U.S. Pat. No. 6,229,221 (Kloen et al.) describes forming a wire bond to a bond pad formed over active devices, where the bond pad and passivation must have specified thickness and be substantially free from interruptions under the wire bonding region.

SUMMARY OF THE INVENTION

A principal objective of the invention is to provide a method and structure to enable wire bond connections over device regions of a semiconductor die, whereby damage to underlying layers of dielectric, active and/or passive devices is avoided.

Another objective of the invention is to reduce semiconductor die size, and thus manufacturing cost, for integrated circuits to be connected to next level packaging by wire bonding.

In accordance with the objectives of the invention, a new method and structure for enabling wire bond connections over active regions of an Integrated Circuit die is provided. A semiconductor die, on which are formed active and/or passive devices, has at least one interconnect metal layer having at least one top level metal contact, and a passivation layer over the interconnect metal layer, wherein the passivation layer comprises at least one opening through which is exposed the top level metal contact point. A compliant metal bond pad is formed over the passivation layer, connected to the top level metal contact through the opening.

Various types, configurations or designs of openings through the layer of passivation are provided. Optionally, a layer of compliant material is formed between the compliant metal bond pad and passivation. Wire bonding may later be performed to the bond pad.

BRIEF DESCRIPTION OF THE DRAWINGS

FIGS. 1a and 1b show conventional methods of creating wire bond connections to an Integrated Circuit die.

DESCRIPTION OF THE PREFERRED EMBODIMENTS

Figure 2:
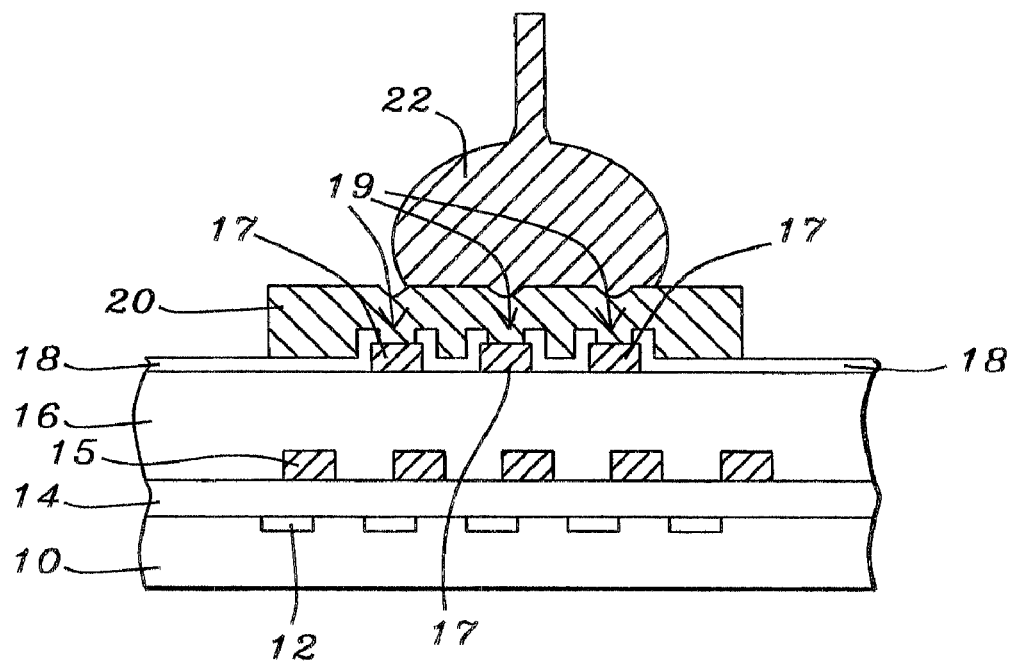
FIG. 2 is a cross-sectional drawing of the invention for a compliant metal to which a wire bond connection has been made.

Conventional wire bonding methods and methods of I/O interconnect can result in damage being inflicted on underlying layers of dielectric, such as those layers of dielectric over which the interconnecting bond pads are formed. Furthermore, common industry practice has been to locate active devices away from the areas under bond pads, to avoid damage to the devices during wire bonding. This results in a significant increase in die size, causing extra manufacturing cost.

The invention provides a method which allows wire bonding connections to a semiconductor die to be made over active and/or passive devices, without damage to the devices or to intervening dielectric layers.

Conventional wire bond connections are provided along the periphery of an Integrated Circuit (IC). The bond pads are laterally displaced from the active device region in order to avoid the negative impact of mechanical stress that is introduced to and through underlying layers of dielectric during and as a result of wire bonding.

This is illustrated using FIGS. 1*a* and 1*b*, whereby FIG. 1*a* highlights a first region 70 in which active and/or passive devices are formed. The first region 70 is separate from a second region 75, over which bond pads 77 are formed. The top view shown in FIG. 1*a* is shown in cross section in FIG. 1*b*, wherein specifically are highlighted a substrate 71, in or over the surface of which active and/or passive devices 72 have been created. A first layer 73 of interconnect metal is shown, which is typically connected at one or more points by contacts 74, to devices 72. One or more overlying layers 81 of interconnect metal are formed, in one or more layers of intermetal dielectric 76, with a top metal layer from which bond pads 77 are formed. Bond pad 77 and wire bond 80 are formed in second region 75, and are laterally separated from above the first region 70. As shown in FIGS. 1*a* and 1*b*, no active and/or passive devices are formed underlying the bond pad 77.

This requirement, of laterally separating wire bonding pads 77 from underlying active and/or passive devices 72 created in or over a semiconductor die, as highlighted in FIGS. 1*a* and 1*b*, causes the need for a significant increase in die size since the area 70 is not available at the die top surface for wire bond connections.

The invention will now be described in detail using FIGS. 2-8*c*.

Referring first specifically to the cross section that is shown in FIG. 2, the following elements are shown:

10, a substrate in or over which active semiconductor devices have been created (alternately, or in addition to, passive elements such as metal lines, capacitors, resistors, inductors and the like)

12, a representative sample of the semiconductor devices that have been created in or over substrate 10; conductive points of electrical contact to devices 12 (not shown) are provided 14, a first layer of interlevel dielectric 15, metal interconnections in one or more layers 16, intermetal dielectric 17, contact pads formed from the top metal layer of interconnect metal 18, a layer of passivation deposited over the layer 16 of intermetal dielectric and contact pads 17

19, openings created through the layer 18 of passivation for access to contact pads 17

20, of significant importance to the invention, a layer of compliant metal formed over passivation layer 18

22, a wire bond connection provided to layer 20 of compliant metal.

The preferred method for the creation of wire bonding pad 20 comprises the following steps:
 1. barrier layer sputtering
 2. seed layer sputtering
 3. a photo-lithographic process to define an opening for the bulk metal
 4. electroplating the bulk metal
 5. photoresist strip
 6. seed layer metal etch
 7. barrier layer metal etch.

The barrier layer is formed to a preferred thickness of about 3000 Angstroms, and is preferably formed of TiW (titanium tungsten). The seed layer is formed to a preferred thickness of about 1000 Angstroms and is preferably Au (gold). The photoresist used in step 3. above is preferably formed to a thickness of between about 10 and 12 μm.

Compliant metal 20 is preferred to be created to a minimum thickness of about 1.0 μm, but is preferably more than 2 um thick, and is preferably formed of Au. More generally, the thickness of the compliant metal should be based on the amount of energy the pad needs to absorb during wirebonding. The thicker the compliant metal pad thickness, the more energy the pad will be able to absorb.

Figure 3:
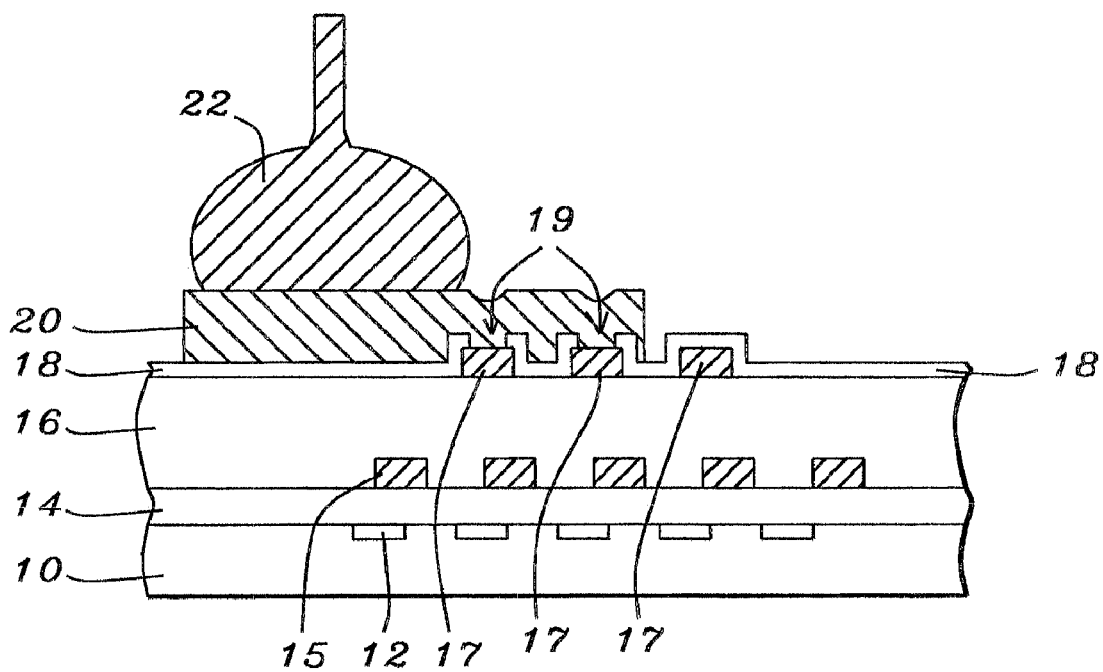
FIG. 3 shows a cross section of a second embodiment of the invention for compliant metal to which a wire bond connection has been made.

The small passivation openings 19 in FIGS. 2 and 3, have a minimum cross section of about 0.1 μm, but are preferably at least 0.5 um. Passivation openings 19 may be formed over only one of the contact pads 17, but preferably some or all contact pads 17 under wirebond pad 20 have passivation openings formed thereover, as shown in FIG. 2.

Referring now to FIG. 3, in an alternative embodiment the wire bonding region, to which wire bond 22 attaches, is displaced laterally with respect to one or more of the openings 19 that has been provided through the passivation layer 18. This allows for an offset of the wire bond 22 with respect to the passivation openings, providing additional flexibility in positioning the wire bond connection.

Figure 4A:
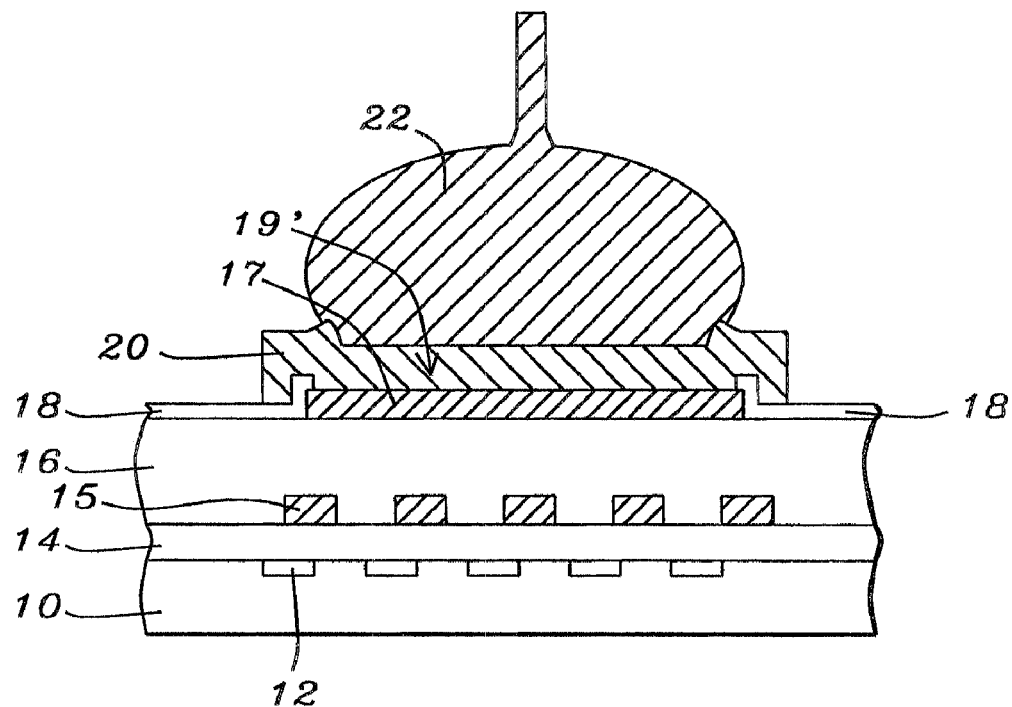
FIGS. 4a and 4b show a cross sections of a third embodiment of invention showing compliant metal to which a wire bond connection has been made.

With reference to FIG. 4*a*, another embodiment is shown providing additional flexibility of providing wire bond connections to a semiconductor device, by providing a larger contact pad 17. By creating a large opening 19" through the passivation layer 18, the layer 20" of compliant metal contacts the top layer 17 of metal over a larger surface area, thus decreasing the interconnect series resistance of the bond pad/contact pad connection.

The large passivation opening to contact pad 17, shown in FIG. 4*a*, has a width of between about 40 μm and 100 μm.

Figure 4B:
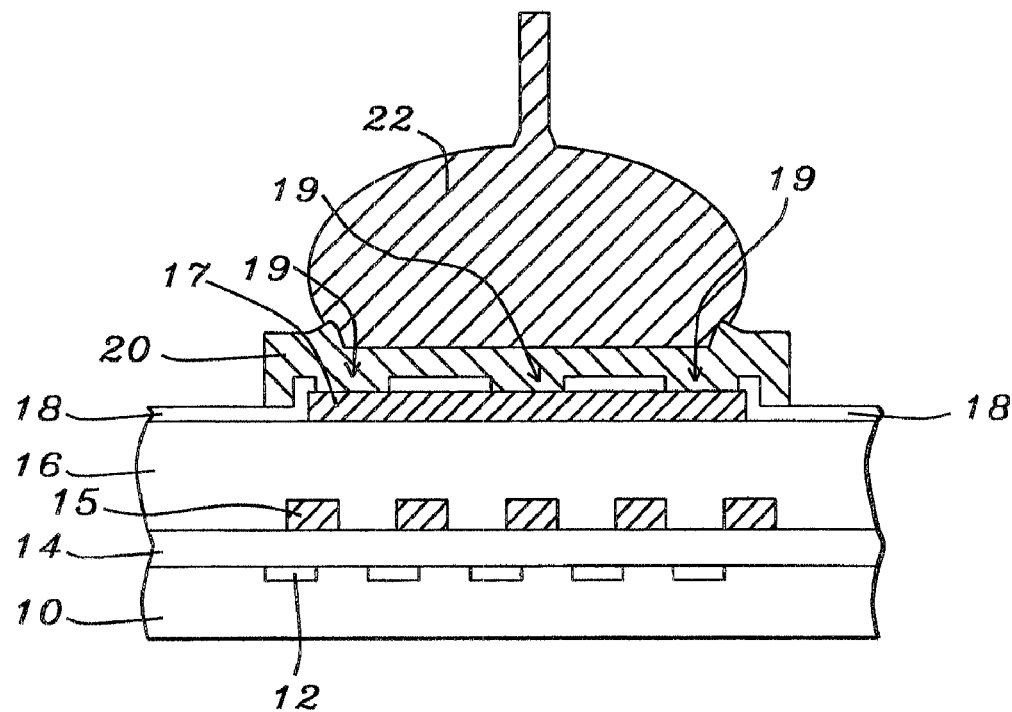

Yet another embodiment of the invention is shown in FIG. 4*b*, in which a large contact pad 17 is used, but with multiple openings through the passivation layer 18, which results in improved planarity of the top surface of bond pad 20.

Figure 5A:
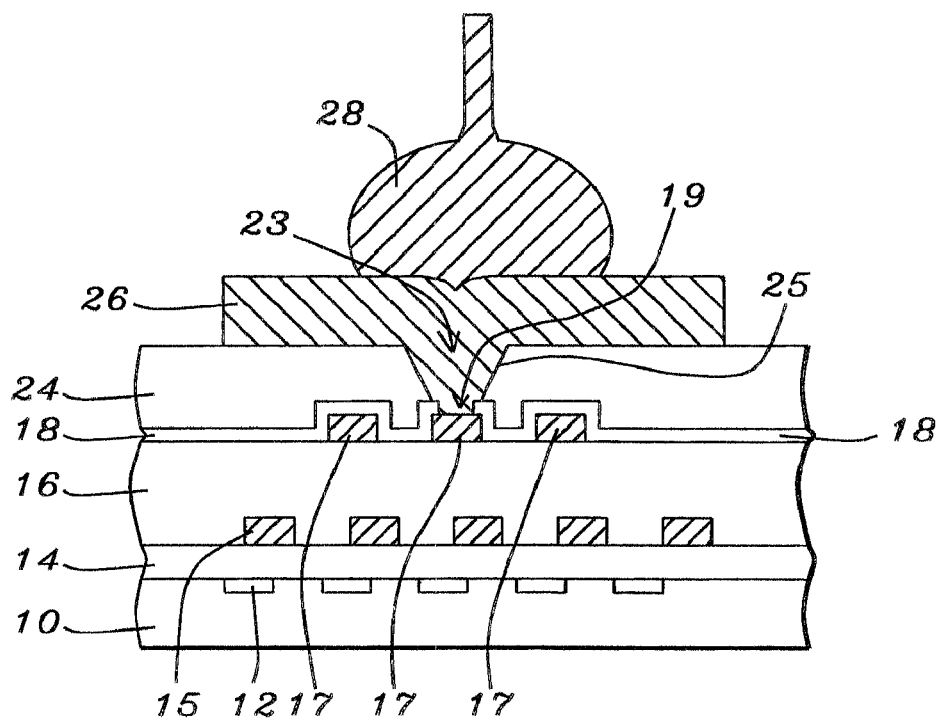
FIGS. 5a-5c show cross sections of a fourth embodiment of the invention, for a compliant material over which a layer of pad metal has been created, a wire bond connection has been made to the layer of pad metal.

In order to further enhance absorption of bonding stresses, the invention provides for, in another alternative embodiment as shown in FIG. 5*a*, a layer 24 of a compliant post-passivation dielectric material, under compliant metal 26. This compliant buffer layer 24 is preferably an organic material such as polyimide, benzocyclobutene (BCB) or the like, and further assists in preventing damage to underlying dielectric layer(s) 16 and active/passive devices 12. Other polymer materials that may be used for layer 24 include elastomers such as silicone, or parylene. Compliant layer 24 is typically deposited by spin-on techniques.

Opening 23 is created through the compliant post-passivation dielectric 24, and extends to passivation opening 19, providing access to top level contact point 17. The opening may have substantially vertical sidewalls 25, however the sidewalls are preferably sloped as shown in FIG. 5*a*. Compliant post-passivation dielectric 24, such as polyimide, is spun on and exposed and developed to have vertical sidewalls, however the subsequent curing process causes the sidewalls to have the desired slope.

The sidewall slope 25 may have an angle α of 45 degrees or more, and is typically between about 50 and 60 degrees. It may be possible to form the sidewalls with an angle as small as 20 degrees.

As described earlier, the preferred method for the creation of bond pad 26 is electroplating. Processing conditions applied for the embodiment of FIG. 5a are as follows:

1. barrier layer metal sputtering
2. seed metal sputtering
3. photo-lithographic process
4. electroplating
5. photoresist strip
6. seed metal etching, and
7. barrier metal etching.

Layer 26 is created to a preferred minimum thickness of about 1 μm, with gold the preferred material.

The preferred method for the creation of the compliant buffer layer 24 of dielectric is spin coating, with layer 24 preferably created to a minimum thickness of about 2 μm. The preferred deposition processing steps for the creation of the buffer layer 24 are the following:

1. spin-coating of photo-sensitive material
2. photo lithographic exposure and development, and
3. curing.

Alternately, compliant buffer layer 24 may be formed by screen printing, as is known in the art, a layer of polymer, such as polyimide or BCB, and then curing the layer.

Figure 5B:
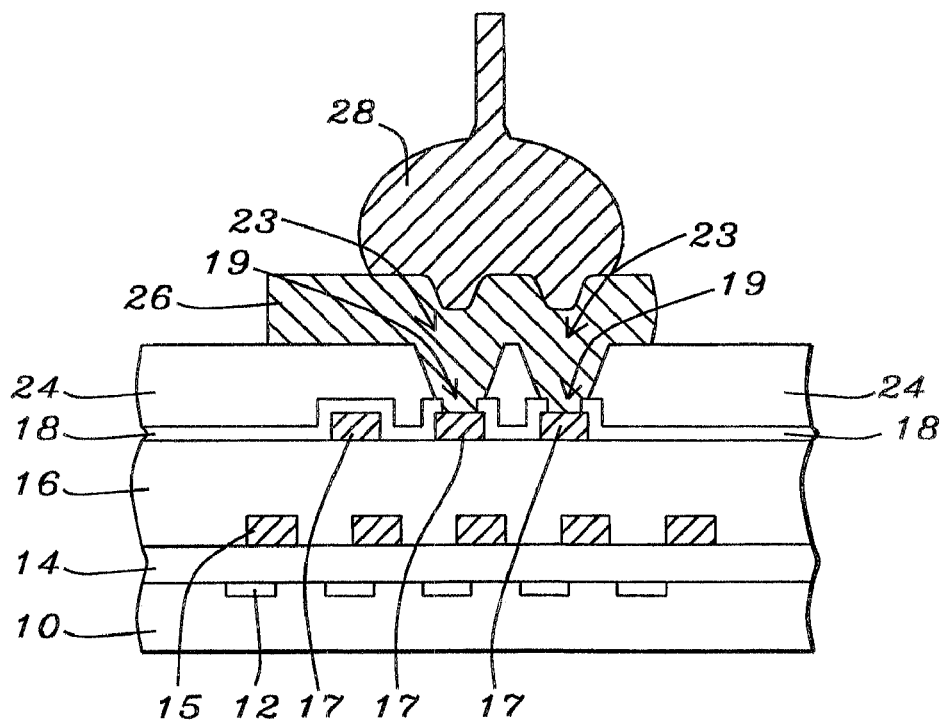

FIG. 5b shows an alternative to the FIG. 5a structure, in which multiple openings in the compliant dielectric layer 24 are formed, to connect wirebond pad 26 through multiple passivation openings 19 to multiple contact pads 17.

Figure 5C:
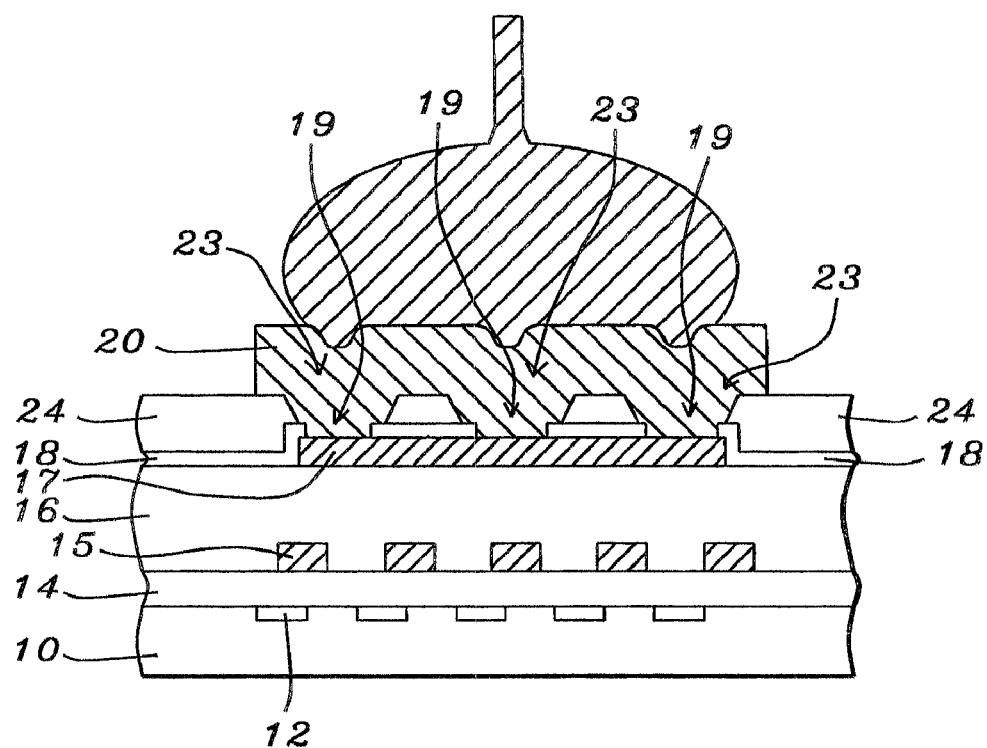

FIG. 5c shows another alternative to the FIG. 5a structure, in which multiple openings in the compliant dielectric layer 24 are formed, to connect wirebond pad 26 through multiple passivation openings 19 to a single, large contact pad 17.

Figure 6:
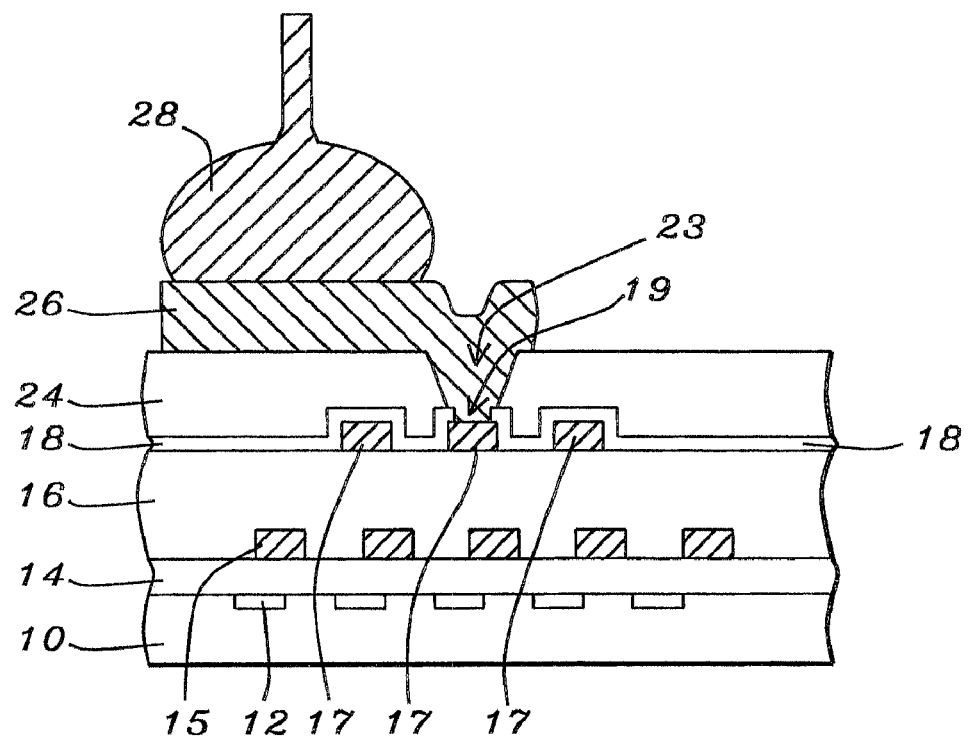
FIG. 6 shows a cross section of a fifth embodiment of the invention, for a compliant material over which a layer of pad metal has been created, a wire bond connection has been made to the layer of pad metal.

As yet a further extension, as shown in FIG. 6, the invention provides for offsetting the location of the wire bond 28 connection with respect to the connection(s) to contact pad(s) 17.

It is clear that the invention lends itself to numerous variations in the application of the layer of compliant metal and compliant post-passivation dielectric material. The examples shown using FIGS. 2 through 6 have shown only two layers of overlying interconnect traces. It is clear that the invention is not limited to two layers of interconnect metal but can be equally applied with any number of such layers.

As noted earlier, the invention is not limited to one opening created through a protective layer of passivation. The invention is also not limited as to the location of the one or more openings that are created through the layer of passivation. What is critical to the invention is the application of a layer of compliant material, which serves as a buffer between active and/or passive devices and contact pads to which wire bond connections are to be provided.

Specifically and relating to the above comments it can be realized that, in the cross section shown in FIG. 3, the off-set of the wire bond 22 can be provided laterally in either direction with respect to the contact point 17. Also and still specifically referring to the cross section of FIG. 3, the opening 19 through the layer 18 of passivation can be extended to two or more openings, each of the openings providing access to points 17 of top level metal over the surface of the layer 16 of intermetal dielectric.

The cross sections that are shown in FIGS. 2 and 3 apply to the creation of small contact pads (compared to conventional bond pads) for which small vias are created through the layer 18 of passivation, while the cross section that is shown in FIG. 4 applies to the creation of a large contact pad for which a large via is created through the passivation layer 18.

An experiment was performed in which the structure depicted in FIG. 2 was formed, using 4 μm thick electroplated gold as the compliant metal 20, and Fluorinated Silicate Glass (FSG) as the intermetal dielectric 16. After wire bonding, no damage to the intermetal dielectric was observed.

Referring now to FIGS. 7 and 8a-8c, additional detail will be discussed with regard to materials and methods of forming the wirebond pad of the invention.

Passivation layer 18 is typically formed of an inorganic material. Typically, this comprises silicon oxide at about 0.5 μm thick over which is formed silicon nitride at about 0.7 μm thick. Other materials and thicknesses, as are known in the art, may be used. The passivation layer protects underlying active and/or passive devices from the penetration of mobile ions, transition metals, moisture, and other contamination.

Figure 7:
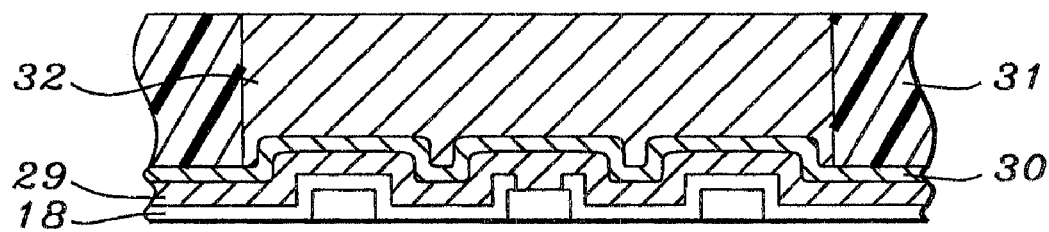
FIG. 7 shows a cross section of compliant metal.

In one embodiment of the invention, as shown in FIG. 7, a glue/barrier layer 29 is deposited over passivation layer 18. The glue/barrier layer 29 preferably comprises Ti, Cr (chromium), TiW or TiN (titanium nitride). The preferred method for the creation of glue/barrier layer 29 is sputtering.

An electroplating seed layer 30 is formed over the glue/barrier layer 29, preferably by sputtering Au to a thickness of about 1000 Angstroms.

Bondpad layer 32, of electroplated soft Au, is formed over the seed layer, using a photolithographic process as earlier described.

The Au bondpad layer 32, shown in FIG. 7, has the following characteristics:
- a hardness range of less than about 150 Hv (Vickers Hardness), whereby softer Au is preferred, since softer Au is better suited for stress absorption during wire bond formation
- an Au purity larger than about 97%, and
- a thickness larger than about 1 μm, since a thickness less than about 1 μm does not provide adequate stress absorption.

Figure 8A:
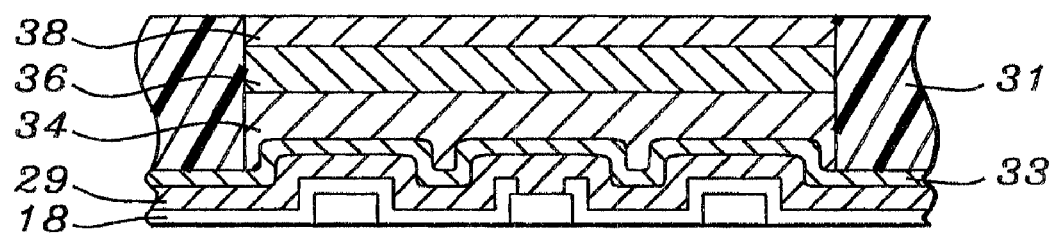
FIGS. 8a through 8c show layers of material that can be used to form compliant metal.
Figure 8B:
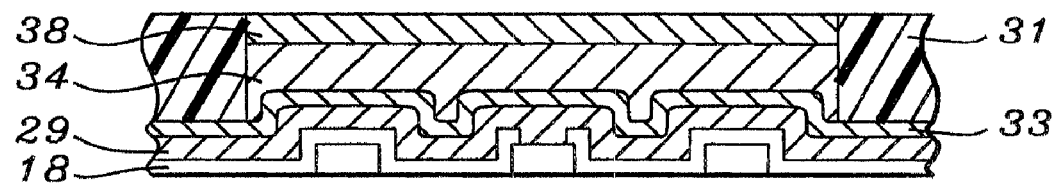
Figure 8C:
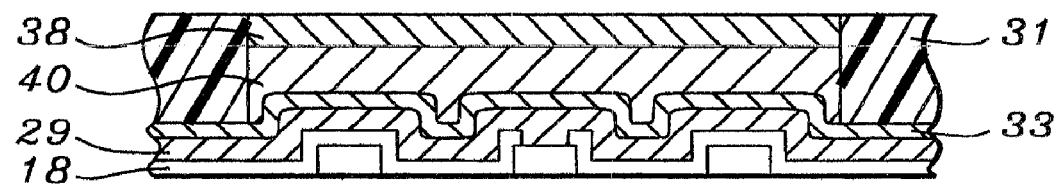

Referring now to FIGS. 8a through 8c, three further embodiments of the invention are shown, in which a composite metal system is used to form the compliant metal pad.

In all three embodiments, a glue/barrier layer 29 is deposited over passivation layer 18. Layer 29 preferably comprises Ti or Cr, formed to a preferable thickness of about 500 Angstroms. A seed layer 33 is formed over the barrier 29, and preferably comprises sputtered Cu, formed to a preferable thickness of about 5000 Angstroms.

Referring now specifically to FIG. 8a, a composite metal system 34/36/38 is shown, preferably comprising electroplated Cu/Ni/Au, respectively. The bottom layer 34 of Cu forms a bulk conduction layer, and is preferred to have a thickness larger than about 1 μm. Center layer 36 of Ni is used as a diffusion barrier, and is preferably formed to a thickness of between about 1 and 5 microns. The top Au layer 38, is wire-bondable, and has a preferred thickness of at least 0.1 micron. Alternately, the top wire bondable layer may be aluminum (Al).

In the next embodiment, as shown in FIG. 8b, a two-metal system is used. A first bulk conduction layer 34, preferably comprising Cu, is formed over the seed layer 33, and is preferably formed to a thickness of greater than about 1 micron. The second layer 38, for wire bonding purposes, is formed over layer 34, and preferably comprises Au of 0.1 micron, or Al.

In the embodiment shown in FIG. 8c, an electroplated solder 40 is used as the bulk conduction metal, with Au (or Al) layer 38 used for wirebonding. The electroplated solder may comprise Pb-alloy, Sn, Sn-alloy, or a lead-free solder such as AgSn alloy or AgCuSn alloy. A seed layer 33 preferably comprises Cu or Ni.

In the above embodiments of FIGS. 7 and 8a-8c, the compliant metal bond pads are formed as follows. A semiconductor wafer having top contact pads exposed through a layer of passivation 18 is provided. The glue/barrier layer 29 and electroplating seed layer 33 are deposited, typically by sputtering. Next, the wafer is coated with a layer of photoresist 31 having a thickness of less than 12 microns, with bond pad openings patterned by photolithography, as is known in the semiconductor art. Electroplating is then performed for the various subsequent metal layers shown in these Figures, including the top wire-bondable layer 38 of gold. Alternatively, electroless plating may be used to form wire-bondable layer 38 to a thickness of as little as 100 Angstroms. A gold layer 32 with a thickness of less than 12 microns may be electroplated on the seed layer 30 exposed by the opening in the photoresist layer 31, as shown in FIG. 7. The photoresist 31 is then stripped. The seed layer 33 and glue/barrier 29 are etched using the bond pad as a mask, to complete the structure, which is now ready for wire bonding.

For the layers shown in cross section in FIGS. 8a-8c, the Following preferred thicknesses apply:
  the layer of Cu 34 is preferred to have a thickness larger than about 1 μm
  the diffusion layer 36 of Ni is preferred to have a thickness larger than about 0.5 μm
  the wirebondable Au layer 38 is preferred to have a thickness larger than about 100 Angstroms
  the layer of Pb-alloy, sn or Sn-alloy 40 is preferred to have a thickness larger than about 1 μm.

Further, with the layer of Pb-alloy, Sn or Sn-alloy, as shown in the cross section of FIG. 8c, additional composite layers such as a layer 34 (of Cu) or a layer 36 (of Ni) can be applied between layer 40 and the glue/barrier layer 29.

To adjust the hardness of the Au layer, the Au layer is annealed at a temperature of between about 120° C. and 350° C., resulting in a hardness of between about 150 and 15 HV (the higher hardness corresponding to a lower annealing temperature, a lower hardness corresponding to a higher annealing temperature). A preferred annealing temperature is about 270° C., which results in a hardness of about 50 Hv. Additionally, annealing may be performed in an $N_2$ ambient.

The compliant layer 20, as shown in the cross section of FIG. 1, may also be used to form low resistance power and ground planes, and/or for signal lines, above passivation layer 18, as shown in U.S. Pat. No. 6,383,916, which is herein incorporated by reference.

The metal pad of the invention is referred to as "compliant", as further described in the following. The compliant metal pad of the invention can be used to protect underlying active and/or passive devices and/or low-k dielectrics, from damage during wire bonding, because it serves as both a stress buffer (by its elasticity) and a shock wave absorber (by its ductility). To absorb mechanical energy, a material must be soft, ductile (i.e., malleable), and sufficiently thick. Being soft (i.e., having high elasticity) is not sufficient to absorb much mechanical energy. It is the process of plastic deformation that determines how much mechanical energy a material can absorb. Further, the thicker the material, the greater is the energy that can be absorbed. Metals such as Au, Cu, solder and Al are all soft, for the purposes of the invention, but Au and solder are able to absorb more mechanical energy than Cu and Al due to their ductility.

The total thickness of the compliant metal bond pads is preferred to be more than 1.5 um., in order to sufficiently absorb bonding energy.

Low-k dielectric materials that could be used and protected from wire-bonding damage by the invention include CVD-deposited dielectrics including but not limited to polyarylene ether, polyarylene, polybenzoxazole, and spun-on dielectrics having a $Si_wC_xO_yH_z$ composition. These low-k dielectrics generally have a dielectric constant less than 3.0, but are at least less than the dielectric contant of CVD-deposited $SiO_2$, which has a dielectric constant of about 4.2.

A key advantage of the invention is the reduction in die size allowed by the placing of bond pads over the active devices, as compared to the traditional industry practice of laterally displacing the bonding regions from the active region. Further, due to the compliant nature of gold used in the bond pads of the invention, there are no restrictions on underlying interconnect metal routing.

The compliant metal bond pad of the invention advantageously provides for absorption of the bonding force during wire bonding, thus preventing damage to active circuits and/or passive devices located underneath the bond pad. This absorption of the bonding force is otherwise difficult to achieve by, for instance, conventional bond pad materials such as aluminum, which are very difficult to deposit and etch at thicknesses sufficient to absorb stress.

The optional, additional organic layer of the invention further helps in absorbing the force that is exerted during wire bonding.

The invention is particularly beneficial, by providing improved force absorption capabilities when compared with prior art methods, for deep-submicron technologies for which low-k dielectrics (which includes CVD or spun-on materials) are increasingly used.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for fabricating a circuit component, comprising:
  providing a semiconductor substrate, an active device in or over said semiconductor substrate, a first interconnect metal layer over said semiconductor substrate, a dielectric layer over said first interconnect metal layer and said semiconductor substrate, a second interconnect metal layer over said dielectric layer, and a passivation layer over said active device, said dielectric layer and said first and second interconnect metal layers, wherein a first opening in said passivation layer is over a contact point of said second interconnect metal layer, and said contact point is at a bottom of said first opening;
  forming a metal pad over said semiconductor substrate, wherein said metal pad is connected to said contact point through said first opening, wherein said forming said metal pad comprises forming a glue layer on said contact point and over said passivation layer, followed by forming a seed layer on said glue layer, followed by forming a photoresist layer on said seed layer, wherein a second opening in said photoresist layer exposes a region of said seed layer, followed by electroplating a copper layer on said region, wherein said copper layer has a thickness greater than 1 micrometer, followed by electroplating a nickel layer on said copper layer in said second opening, wherein said nickel layer has a thickness greater than 0.5 micrometers, followed by electroless plating a gold layer on said nickel layer in said second opening, followed by removing said photoresist layer, followed by etching said seed layer and said glue layer; and bonding a wire to said metal pad using a wirebonding process, wherein a contact area between said metal pad and said wire is vertically over said active device.

2. The method of claim 1 further comprising forming a polymer layer on said passivation layer, followed by said forming said metal pad further on said polymer layer.

3. The method of claim 1, wherein said forming said glue layer comprises sputtering a titanium-containing layer on said contact point and over said passivation layer.

4. The method of claim 1, wherein said forming said glue layer comprises sputtering a chromium-containing layer on said contact point and over said passivation layer.

5. The method of claim 1, wherein said gold layer has a thickness greater than 0.1 micrometers.

6. The method of claim 1, wherein said contact area has a width greater than that of said first opening.

7. The method of claim 1, wherein said forming said seed layer comprises a sputtering process.

8. The method of claim 1, wherein said passivation layer comprises a nitride layer.

9. The method of claim 1, wherein said forming said seed layer comprises forming a copper seed layer on said glue layer.

10. A method for fabricating a circuit component, comprising:
providing a semiconductor substrate, an active device in or over said semiconductor substrate, a first interconnect metal layer over said semiconductor substrate, a dielectric layer over said first interconnect metal layer and said semiconductor substrate, a second interconnect metal layer over said dielectric layer, a passivation layer over said active device, said dielectric layer and said first and second interconnect metal layers, wherein a first opening in said passivation layer is over a contact point of said second interconnect metal layer, and said contact point is at a bottom of said first opening, and a polymer layer on said passivation layer, wherein a second opening in said polymer layer is over said contact point;
forming a metal pad over said polymer layer, wherein said metal pad is connected to said contact point through said second opening, wherein said forming said metal pad comprises forming a glue layer, forming a seed layer on said glue layer, forming a photoresist layer on said seed layer, wherein a third opening in said photoresist layer exposes a region of said seed layer, electroplating a copper layer on said region, wherein said copper layer has a thickness greater than 1 micrometer, forming a nickel layer on said copper layer, electroless plating a gold layer on said nickel layer, removing said photoresist layer, and etching said seed layer and said glue layer; and
bonding a wire to said metal pad using a wirebonding process, wherein a contact area between said metal pad and said wire is vertically over said active device.

11. The method of claim 10, wherein said passivation layer comprises a nitride layer.

12. The method of claim 10, wherein said providing said polymer layer comprises forming a polyimide layer on said passivation layer.

13. The method of claim 10, wherein said gold layer has a thickness greater than 0.1 micrometers.

14. The method of claim 10, wherein said contact area has a width greater than that of said first opening.

15. The method of claim 10, wherein said forming said seed layer comprises a sputtering process.

16. The method of claim 10, wherein said providing said polymer layer comprises a spin-coating process.

17. The method of claim 10, wherein said forming said glue layer comprises sputtering a titanium-containing layer.

18. The method of claim 10, wherein said forming said glue layer comprises sputtering a chromium-containing layer.

19. The method of claim 10, wherein said forming said seed layer comprises forming a copper seed layer on said glue layer.

20. The method of claim 10, wherein said forming said metal pad further comprises said forming said nickel layer with a thickness greater than 0.5 micrometers.

21. A method for fabricating a circuit component, comprising:
providing a semiconductor substrate, an active device in or over said semiconductor substrate, a first interconnect metal layer over said semiconductor substrate, a dielectric layer over said first interconnect metal layer and said semiconductor substrate, a second interconnect metal layer over said dielectric layer, a passivation layer over said active device, said dielectric layer and said first and second interconnect metal layers, wherein a first opening in said passivation layer is over a contact point of said second interconnect metal layer, and said contact point is at a bottom of said first opening, wherein said passivation layer comprises a nitride layer, and a polymer layer on said passivation layer, wherein a second opening in said polymer layer is over said contact point;
forming a metal pad over said polymer layer, wherein said metal pad is connected to said contact point through said second opening, wherein said forming said metal pad comprises forming a glue layer, followed by forming a first copper layer on said glue layer, followed by electroplating a second copper layer on said first copper layer, wherein said second copper layer has a thickness greater than 1 micrometer, followed by forming a nickel layer on said second copper layer, followed by forming a gold layer over said nickel layer; and
bonding a wire to said metal pad using a wirebonding process, wherein a contact area between said metal pad and said wire is vertically over said active device and not vertically over said contact point.

22. The method of claim 21, wherein said forming said glue layer comprises forming a titanium-containing layer.

23. The method of claim 21, wherein said contact area has a width greater than that of said first opening.

24. The method of claim 21, wherein said providing said polymer layer comprises a spin-coating process.

25. The method of claim 21, wherein said forming said glue layer comprises a sputtering process.

26. The method of claim 21, wherein said forming said first copper layer comprises a sputtering process.

27. The method of claim 21, wherein said forming said glue layer comprises sputtering a titanium-containing layer.

28. The method of claim 21, wherein said forming said metal pad further comprises said forming said nickel layer with a thickness greater than 0.5 micrometers.

29. A method for fabricating a circuit component, comprising:
providing a semiconductor substrate, an active device in or over said semiconductor substrate, a first dielectric layer over said semiconductor substrate, a first metal interconnect over said first dielectric layer, a second dielectric layer over said first metal interconnect and said first dielectric layer, a second metal interconnect on said second dielectric layer, a third metal interconnect on said second dielectric layer, wherein said second and third metal interconnects are at a same horizontal level, wherein said second metal interconnect has a portion spaced apart from said third metal interconnect, and a passivation layer over said second dielectric layer and on said third metal interconnect, wherein a first opening in said passivation layer is over a contact point of said second metal interconnect, and said contact point is at a bottom of said first opening, wherein said passivation layer comprises a nitride;

forming a metal pad over said semiconductor substrate, wherein said metal pad is connected to said contact point through said first opening, wherein said forming said metal pad comprises forming a glue layer on said contact point and over said passivation layer, followed by forming a first copper layer on said glue layer, followed by forming a photoresist layer on said first copper layer, wherein a second opening in said photoresist layer exposes a region of said first copper layer, followed by electroplating a second copper layer on said region, wherein said second copper layer has a thickness greater than 1 micrometer, followed by electroplating a nickel layer on said second copper layer in said second opening, followed by forming a wirebondable layer over said nickel layer in said second opening, followed by removing said photoresist layer, followed by etching said first copper layer and said glue layer; and bonding a wire to said metal pad using a wirebonding process, wherein a contact area between said wire and said metal pad is vertically over said active device, vertically over said third metal interconnect, vertically over a first sidewall of said third metal interconnect and vertically over a second sidewall of said third metal interconnect, wherein said first sidewall is opposite to said second sidewall.

30. The method of claim 29, wherein said forming said glue layer comprises forming a titanium-containing layer on said contact point and over said passivation layer.

31. The method of claim 29, wherein said forming said wirebondable layer comprises electroplating a gold layer on said nickel layer.

32. The method of claim 29, wherein said forming said wirebondable layer comprises an electroplating process.

33. The method of claim 29, wherein said forming said wirebondable layer comprises an electroless plating process.

34. The method of claim 29, wherein said portion of said second metal interconnect comprises said contact point.

35. A method for fabricating a circuit component, comprising:

providing a semiconductor substrate, an active device in or over said semiconductor substrate, a first dielectric layer over said semiconductor substrate, a first metal interconnect over said first dielectric layer, a second dielectric layer over said first metal interconnect and said first dielectric layer, a second metal interconnect on said second dielectric layer, a third metal interconnect on said second dielectric layer, wherein said second and third metal interconnects are at a same horizontal level, wherein said second metal interconnect has a portion spaced apart from said third metal interconnect, a passivation layer over said second dielectric layer and on said third metal interconnect, wherein an opening in said passivation layer is over a contact point of said second metal interconnect, and said contact point is at a bottom of said opening, wherein said passivation layer comprises a nitride, a polymer layer over said passivation layer, and a metal pad over said passivation layer, wherein said metal pad is connected to said contact point through said opening, wherein said metal pad comprises a glue layer, a first copper layer on said glue layer, a second copper layer on said first copper layer, a nickel layer on said second copper layer and a wirebondable layer over said nickel layer; and bonding a wire to said metal pad using a wirebonding process, wherein a contact area between said wire and said metal pad is vertically over said active device, vertically over said third metal interconnect, vertically over a first sidewall of said third metal interconnect and vertically over a second sidewall of said third metal interconnect, wherein said first sidewall is opposite to said second sidewall.

36. The method of claim 35, wherein said glue layer comprises a titanium-containing layer under said first copper layer.

37. The method of claim 35, wherein said wirebondable layer comprises a gold layer on said nickel layer.

38. The method of claim 35, wherein said portion of said second metal interconnect comprises said contact point.

* * * * *